United States Patent
Pines et al.

(10) Patent No.: US 7,750,633 B2
(45) Date of Patent: Jul. 6, 2010

(54) LOW FIELD MAGNETIC RESONANCE IMAGING

(75) Inventors: Alexander Pines, Berkeley, CA (US); Dimitrios Sakellariou, Billancourt (FR); Carlos A. Meriles, Fort Lee, NJ (US); Andreas H. Trabesinger, London (GB)

(73) Assignee: The Regents of the University of California, Oakland, CA (US)

( * ) Notice: Subject to any disclaimer, the term of this patent is extended or adjusted under 35 U.S.C. 154(b) by 646 days.

(21) Appl. No.: 11/570,357

(22) PCT Filed: Jul. 21, 2005

(86) PCT No.: PCT/US2005/026264
§ 371 (c)(1),
(2), (4) Date: Jul. 27, 2007

(87) PCT Pub. No.: WO2006/023208
PCT Pub. Date: Mar. 2, 2006

(65) Prior Publication Data
US 2009/0261826 A1      Oct. 22, 2009

Related U.S. Application Data

(60) Provisional application No. 60/590,581, filed on Jul. 22, 2004.

(51) Int. Cl.
*G01V 3/00*     (2006.01)
(52) U.S. Cl. ........................ 324/309; 324/306
(58) Field of Classification Search .................. 324/309, 324/306
See application file for complete search history.

(56) References Cited

U.S. PATENT DOCUMENTS

| | | | |
|---|---|---|---|
| 5,023,555 A | 6/1991 | Ehnholm | |
| 5,235,279 A | 8/1993 | Kaufman et al. | |
| 5,623,206 A * | 4/1997 | McDonald et al. | .......... 324/309 |
| 6,275,039 B1 | 8/2001 | Young et al. | |
| 6,818,202 B2 | 11/2004 | Pines et al. | |
| 6,885,192 B2 * | 4/2005 | Clarke et al. | ................. 324/300 |
| 2001/0037063 A1 | 11/2001 | Albert et al. | |
| 2004/0027125 A1 | 2/2004 | Clarke et al. | |

FOREIGN PATENT DOCUMENTS

GB     2 353 865     3/2001

(Continued)

OTHER PUBLICATIONS

Agrawal, "Pre-Polarized MRI in a Zero Readout Magnetic Field and Radiofrequency Selective Excitation in . . . ", Dissertation (UC Berkeley, Chemistry), p. 1-59, (Spring 2004).

(Continued)

*Primary Examiner*—Louis M Arana
(74) *Attorney, Agent, or Firm*—Fulbright & Jaworski LLP

(57) ABSTRACT

A method and system of magnetic resonance imaging does not need a large homogenous field to truncate a gradient field. Spatial information is encoded into the spin magnetization by allowing the magnetization to evolve in a non-truncated gradient field and inducing a set of 180 degree rotations prior to signal acquisition.

20 Claims, 7 Drawing Sheets

FOREIGN PATENT DOCUMENTS

WO    WO-03/067267    8/2003

OTHER PUBLICATIONS

Gao et al., "Effects on Selective Excitation and Phase Uniformity of Concomitant Field Gradient . . . ", Physics in Medicine and Biology, vol. 37 (No. 8), p. 1705-1715, (1992).

Glover, "Lx Echospeed Spiral Pulse Sequence/Recon", Center for Advanced MR Technology at Stanford, p. 1-7, (Sep. 15, 2002).

Meriles et al., "Zero- to Low-Field MRI with Averaging of Concomitant Gradient Fields", Proc. of the Nat. Acad. of Sciences, vol. 102 (No. 6), p. 1840-1842, (Feb. 8, 2005).

Meriles et al., "Tensor Field Magnetic Resonance Imaging", 48th Experimental Nuclear Magnetic Resonance Conference (Typescript), p. 1-30, (Apr. 2007).

Oteo et al., "The Magnus Expansion for Classical Hamiltonian Systems", Journal of Physics A: Mathematical and General, vol. 24, p. 5751-5762, (1991).

Stafford, "High Field MRI: Technology, Applications, Safety, and Limitations", 47th AAPM Annual Meeting, p. 1-5, (Jul. 2005).

* cited by examiner

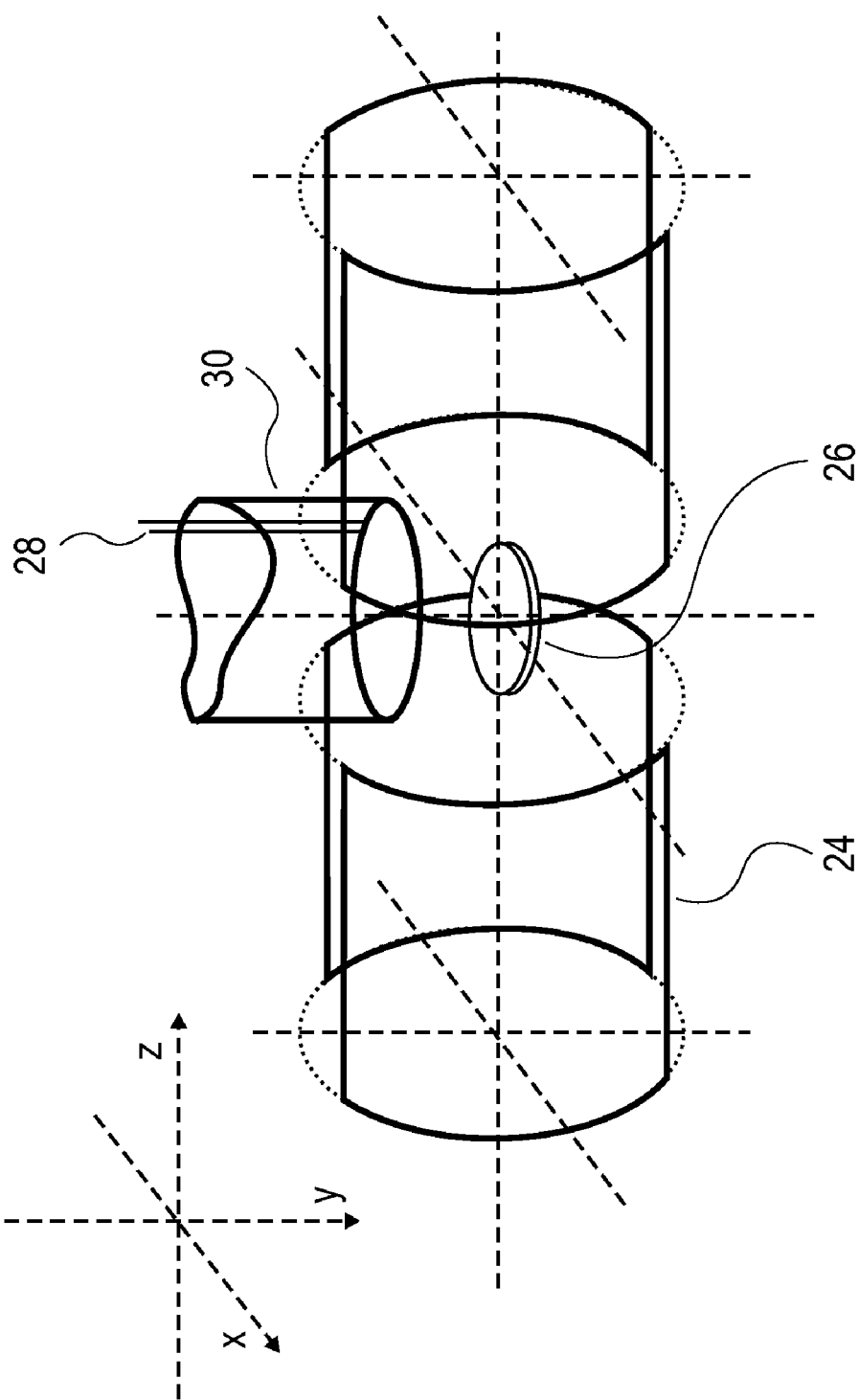

LOW FIELD MAGNETIC RESONANCE IMAGING

CROSS REFERENCE TO RELATED APPLICATIONS

This application claims benefit of priority to Patent Cooperation Treaty case PCT/PCT/US2005/26264 filed Jul. 21, 2005, which in turn claims benefit of priority to U.S. provisional patent application 60/590,581, filed Jul. 22, 2004, entitled "Method and Apparatus for Ultra-High Resolution NMR Spectroscopy Inside Magnets", both of which are hereby incorporated by reference in their entireties.

STATEMENT REGARDING FEDERAL FUNDING

This invention was made with U.S. Government support under Contract Number DE-AC02-05CH11231 between the U.S. Department of Energy and The Regents of the University of California for the management and operation of the Lawrence Berkeley National Laboratory. The U.S. Government has certain rights in this invention.

REFERENCE TO A COMPUTER PROGRAM

Not Applicable.

BACKGROUND OF THE INVENTION

Nuclear magnetic resonance imaging (MRI) serves as an indispensable tool for obtaining images of living specimens such as human beings or single cells in a completely non-invasive manner and without the use of ionizing radiation. In addition, MRI is unique in allowing the generation of images with various kinds of contrast, and therefore images with different information content. MRI is also becoming increasingly important in materials sciences, where the non-destructive nature of the method is of particular interest.

The conventional MRI method relies on the use of two magnetic fields, which are generated by two coils or coil arrays: One is a homogeneous field (called the "$B_0$ field"), the other a supplementary field of known inhomogeneity (called the "gradient field"). The latter field defines the obtainable spatial resolution of the experiment. Generally, finer details of the subject or object under investigation can be revealed if the gradient field is made stronger. However, the maximum allowed strength of the gradient field is limited for the MRI methods practiced today. When the gradient field strength becomes comparable with that of the homogeneous $B_0$ field or even stronger, the conventional methods of image formation start to fail.

When operating at high homogeneous fields of 1.5 or 3 Tesla for example, the condition that the gradient field strength has to be considerably weaker than the $B_0$ field is often readily satisfied. However, even in this situation small but noticeable artifacts can become apparent that have to be corrected in post processing. However, the restricted maximum gradient field strength severely limits imaging in situations where the $B_0$ field is not large compared to the gradient field.

Recent attempts have been made to reduce the values of the required magnetic fields in MRI imaging applications. In recent years, low field setups have been shown to be capable of producing images of good quality within useful (in the context of human imaging) periods of time. In addition, low field MRI is insensitive to certain classes of artifacts such as ghosting due to susceptibility broadening or chemical shift. The latter are omnipresent in high field MRI and, for example, make the imaging of heterogeneous samples difficult or sometimes even impossible. However, the fact that the gradient field still has to be significantly smaller than the weak $B_0$ field imposes limitations to the obtainable spatial resolution of the images.

The physical reason why the homogeneous field has to be considerably (typically five to ten times) stronger than the maximum gradient field is the following: As longs as the gradient field is applied in the presence of a stronger (typically homogeneous) field, certain components of the gradient field become negligible, the field is said to be "truncated". All of the practical MRI schemes in use today rely on truncated gradient fields. When the $B_0$ field is not strong enough to truncate the gradient field, the complete field generated by the gradient field coils has to be considered. Conventional approaches to image formation fail in these circumstances.

SUMMARY OF THE INVENTION

In one embodiment, a method of performing magnetic resonance imaging without a strong homogeneous magnetic field comprises encoding spin density position information into an NMR signal of a sample with both a gradient field and with a coordinated series of magnetization rotations and NMR signal acquisitions. Such a method may, for example, include polarizing a sample having a spatially varying spin induced magnetization and encoding information indicative of the spatial distribution of the spin induced magnetization density by allowing the spins to evolve in a non-truncated gradient field and rotating the spin induced magnetization through a series of predefined angles at predetermined times. An NMR signal produced by the spin magnetization density after at least one of the rotations is detected, and an image of the spin magnetization density using the detected NMR signal is reconstructed.

BRIEF DESCRIPTION OF THE DRAWINGS

FIG. 2 is a conceptual diagram of a magnetic resonance imaging system that may be used in some invention embodiments.

FIG. 6 illustrates an image reconstruction method in accordance with one invention embodiment.

DETAILED DESCRIPTION OF PREFERRED EMBODIMENTS

The following detailed description is directed to certain specific embodiments of the invention. However, the invention can be embodied in a multitude of different ways. In this description, reference is made to the drawings wherein like parts are designated with like numerals throughout.

Set forth below is a family of imaging schemes that involve a conventional low field MRI setup, which may include a coil or an array of coils generating a $B_0$ field as well as gradient field coils as used in a conventional MRI experiment. However, with the present inventions there is no restriction on how large the gradient field may be relative to the $B_0$ field. Our methods work even in the limit where there is no $B_0$ field present at all. This enormously useful degree of freedom comes at the cost of having to supplement the standard MRI setup with an array of coils capable of generating relatively strong field pulses in at least two, but typically three orthogonal directions. The construction and operation of such coils is well known and does not pose a practical problem.

It is shown that applying a train of such field pulses during the experiment is equivalent to truncating the gradient field along one axis such that the resonance frequency varies linearly in one dimension. The direction of the truncation axis can be chosen by adjusting the direction in which the field pulses are applied. With this, a situation equivalent to the high field case is created, where the gradient field is truncated by a strong static magnetic field is achieved. Therefore, standard MRI reconstruction methods can be employed to reconstruct the image of the subject or object.

These imaging methods typically utilize a high amplitude for each field pulse (typically five times the maximum gradient field) as well as a sufficiently high repetition rate of the pulses. The first condition can be relaxed in cases when the gradient field is switched off during the field pulses.

A significant achievement of these methods is that the fundamental limitation in maximum achievable resolution (inherent to the conventional approach) is widely lifted. The truncation of the gradient field is not accomplished as usual by a strong static magnetic field, but by a train of field pulses. The segmentation into a series of field pulses immediately allows the implementation of schemes that compensate not only for experimental imperfections, but also for susceptibility and chemical shift ghosting. Such compensation is not possible if a static magnetic field is used. Furthermore, the homogeneity requirement for the magnetic field pulses are relaxed.

Figure 1:
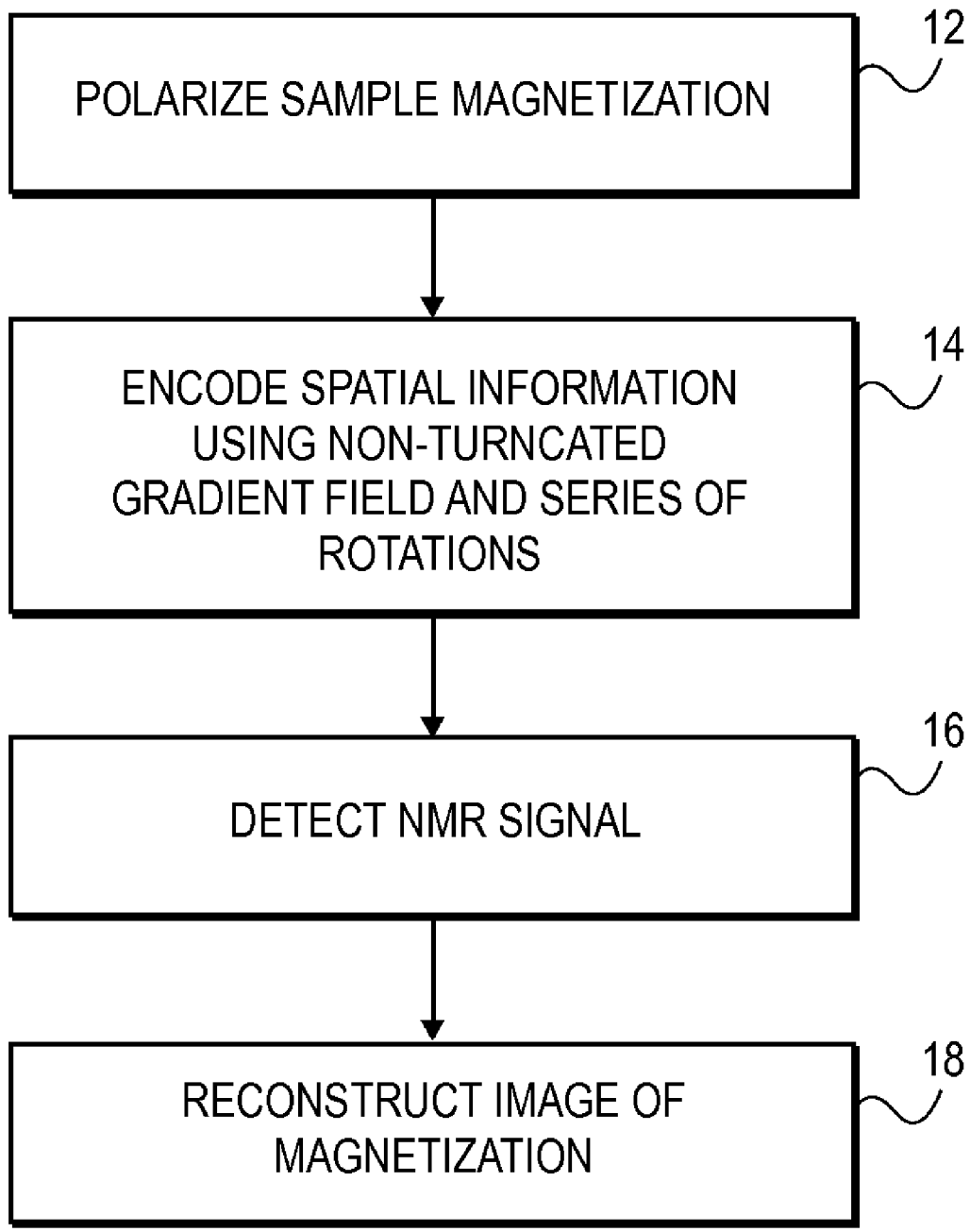
FIG. 1 is a flow chart of a method of low field magnetic resonance imaging in accordance with one embodiment of the invention.

Referring now to FIG. 1, a procedure in accordance with some embodiments of the invention can be represented by the following steps.

At block 12, the spin magnetization density of the sample is polarized in an initial direction. This can be accomplished in various ways such as thermal polarization in a strong transient field (which may be inhomogeneous), optical pumping of noble gases (e.g. $^3$He, $^{129}$Xe), or signal enhancement by dynamic nuclear polarization (DNP), and other methods using the coupling of spin degrees of freedom to other degrees of freedom, e.g. parahydrogen induced polarization (PHIP, PASADENA) or the Haupt effect With the gradient field off, the magnetization can be optionally rearranged globally, e.g. its direction can be adjusted in order to implement auxiliary schemes as for example time-proportional phase incrementation (TPPI). Spin filters can be implemented that will result in pronounced contrast in the final image. Such filters are e.g. relaxation filters that weight the magnetization according to local relaxation behavior.

At block 14, spatial information is encoded about the spatial distribution of the spin magnetization. With the gradient field on, the magnetization precesses in the gradient field. Evolution in the gradient field is accompanied by a series of field pulses at predetermined times, each inducing a predetermined rotation amount. In advantageous embodiments described below, the rotations are 180° with each pulse. If desired, the axes of these rotations can be adapted such that the overall pulse train is symmetrized. Examples are the following sets of flip axes for consecutive pulses: {+x, −x}, {+x, −x, −x, +x}, etc. Depending on the detection scheme (see below), the field pulses can be either applied with detection windows in between them or be played back-to-back. In the later case, the gradient field is advantageously on during the field pulses, whereas in the case of windows between the pulses the gradient field can be switched off during the field pulses. This is possible in low field MRI and will relax the conditions on the strengths of the field pulses. In order to discriminate between positive and negative frequencies, either a TPPI scheme can be employed (see above) or a homogeneous background field can be applied.

The encoding scheme can involve one, two or three dimensions. For each dimension a train of field pulses may be applied for a time that varies from experiment to experiment. If more than one dimension is encoded, the field pulses are first applied along one direction, followed by a 90° rotation (along the direction perpendicular to the two directions of the field pulses before and after the rotation) and a pulse train is applied along a new direction.

At block 16, the resulting NMR signal from the spin magnetization density of the sample can be detected by any method sensitive to magnetic flux and/or magnetic flux changes. This includes inductive detection (e.g. Faraday detectors) as well as magnetometry (e.g. superconducting quantum interference devices (SQUIDs) or atomic magnetometers).

Two acquisition schemes may advantageously be used. In direct detection (gradient field on), the signal is detected in a stroboscopic fashion in between two field pulses. With this method, all encoding steps necessary for one dimension can be detected in ideally one single acquisition. In cases where there is sufficient signal (more specifically, when the number of necessary signal averages is smaller than the number of time points acquired in the signal), this method will be less time consuming than indirect detection.

In indirect detection (gradient field off), after completion of one single encoding step, the signal is acquired, whereupon the experiment is rerun for the next encoding step. In this mode the gradient field is switched off during acquisition, and therefore it is possible to acquire spectral information in addition to the spatial information. During the detection periods further spin manipulation can be applied, e.g. spin echo methods in order to compensate for inhomogeneous broadening of the resonance line.

At block 18, the image is reconstructed from the detected NMR signal(s). In projection-reconstruction imaging, a set of one-dimensional images along different directions is collected and then reconstructed to an image using the inverse Radon transform. In Fourier imaging, two or three dimensions are encoded with the encoding directions being typically orthogonal to each other. The image is reconstructed using the inverse Fourier transform.

Below, details are set forth of methods for reconstructing images in the limit where the static field does not truncate the transverse components of a field generated by a gradient coil. Implicitly we assume that a SQUID is used for signal detection. It is possible to reconstruct an image with small and/or inhomogeneous $B_0$ fields, and even if the uniform static field is eliminated, and only the gradient field is used.

Two different approaches are discussed, both of them utilizing the fact that the rotation symmetry of a curl-free field can be broken by means of radio frequency irradiation and/or prepolarization in a homogeneous field. The first is based on temporal averaging of undesired gradient field components such that an average Hamiltonian can be formulated that only contains fields in one spatial direction. In the second scheme, the initially missing information is encoded into Fourier coefficients and a protocol is used that allows determination of these coefficients.

For simplicity, the specific methods described concentrate here on the case of Golay gradient coils and two dimensional images. However, both methods can be extended to three dimensions in a straightforward manner.

Referring now to FIG. 2, a Golay gradient coil 24 (also called a saddle coil) such as those used in a standard imaging device generates in this case a static non-uniform magnetic field. The system also includes three mutually orthogonal solenoids (not shown) that create relatively strong (compared to the gradient field) and uniform magnetic pulses along any desired direction. For simplicity, we will assume here that our sample is thin—e.g. expansion along y is negligible—and that it is contained in the shaded region 26 in the center of the array. Nearby, a coil coupled to the SQUID 28 in a cryogenic Dewar 30 picks up the signal of the precessing nuclear magnetization. A pre-polarization solenoid—also not shown in the figure—completes the setup. In this case, we will assume that it is oriented perpendicular to the sample plane although, in general, this is not necessary. Notice that, with the exception of this last coil (inherent to prepolarization based systems), the number of coils used is the same as in a high-field imaging system.

The magnetic field due to the saddle coil at each point (x,z) in the sample region can be described by the relation $$\vec{B}(x,z) = g(z\hat{x} + x\hat{z}), \quad (1)$$

where g indicates the (constant) amplitude of the gradient field. This is readily derived from the condition that curl($\vec{B}$)=0 and that the gradient coil is designed in a way to create a linear gradient $$\frac{\partial B_z}{\partial x} = g = const.$$

Figure 3A:
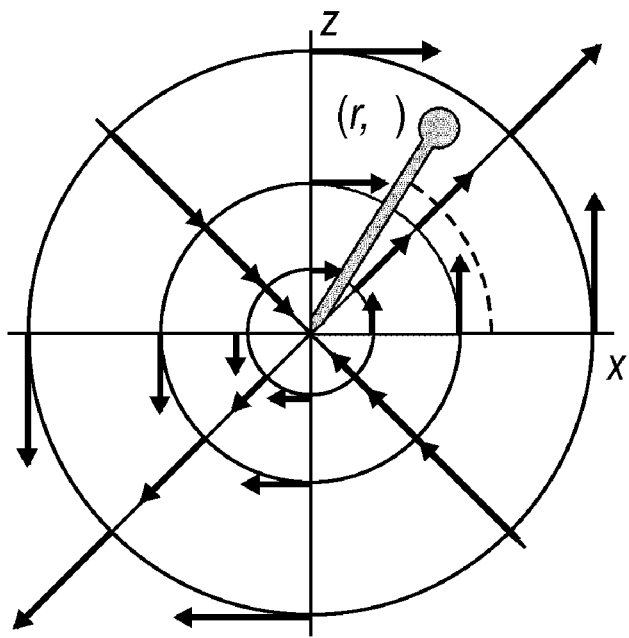
FIGS. 3A and 3B illustrate a saddle coil gradient field in two dimensions.

FIG. 3a visualizes the resulting field. The magnitude of the field increases linearly with the distance r to the center of the setup. Along a ring of fixed radius, its direction varies linearly with the angle.

The Hamiltonian of a spin system in the presence of this magnetic field writes $$H = \gamma \vec{B} \cdot \vec{I} = \omega_r (I_x \sin\theta + I_z \cos\theta), \quad (2)$$

where $\omega_r = \gamma g \sqrt{x^2 + z^2}$, $\tan\theta = z/x$ and $\gamma$ denotes the gyromagnetic ratio. Formula (2) implies that the resonance frequency only depends on the radial distance to the center of the array, i.e. the frequency spectrum only contains information about the distance from the center, but no angular resolution.

Figure 3B:
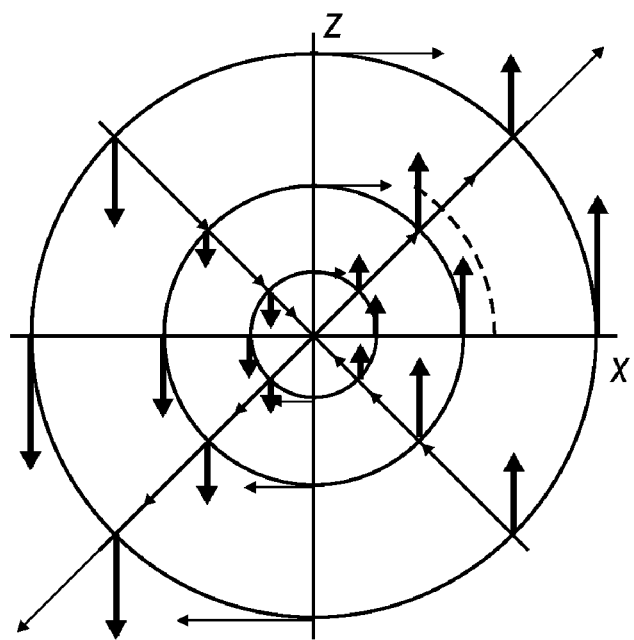

The first possibility to overcome this lack of information is the elimination of one of the vectorial components in (1); the resulting magnetic field then varies linearly over the sample without altering its direction (exactly as in the presence of a truncating field). As shown in FIG. 3b, this is the situation if we superimpose at each point in space two magnetic fields: the original one and another that we will call reflected field and that is obtained at each point after a reflection on an axis, for example, the z-axis. In FIG. 3b, the resulting field points along the z-axis and its magnitude changes linearly with x. This operation has rendered the original cylindrical symmetry Cartesian and, in principle, allows us to obtain a one-dimensional image of the object, in this case, perpendicular to the reflection axis. However, such "reflected fields" are not curl-free and therefore not physical. But it is possible to induce the effect of reflection if $\pi$ pulses (pulses inducing 180 degree rotations of magnetization) along a pre-selected axis are applied during the spin evolution. The formal description of this idea follows below.

Figure 4A:
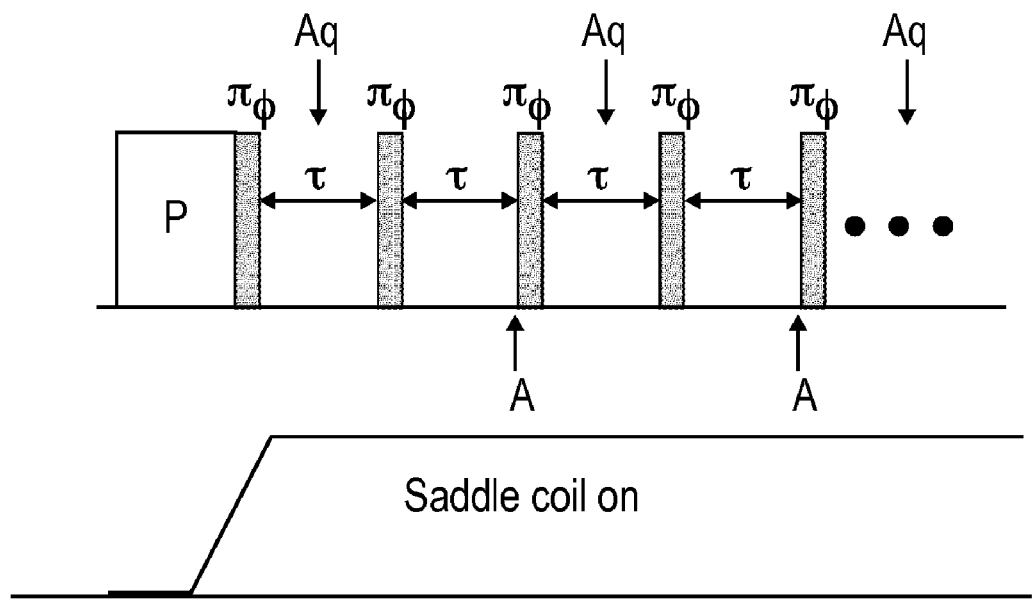
FIGS. 4A and 4B illustrate an image reconstruction method in accordance with one invention embodiment.

Consider the scheme of FIG. 4a. The initial preparation of the system is followed by a train of short and intense $\pi$ rotation pulses separated by a time $\tau$ along the direction $\hat{x}'$. If the acquisition is done stroboscopically following every other $\pi$ pulse (see figure), the evolution operator U evaluated at the n-th cycle satisfies the relation $$U(2n\tau) = [U(2\tau)]^n, \quad (3)$$

where $$U(2\tau) = \exp(-iH\tau)\exp(-i\pi I_{x'})\exp(-iH\tau)\exp(-i\pi I_{x'}). \quad (4)$$

Explicitly rewriting the Hamiltonian and using the Magnus expansion we get $$U(2\tau) = \exp(-i\gamma\tau(B_{x'}I_{x'} + B_{z'}I_{z'}))\exp(-i\gamma\tau(B_{x'}I_{x'} - B_{z'}I_{z'})) = \quad (5)$$
$$= \exp(-i2\gamma\tau\vec{B}_{eff} \cdot \vec{I}),$$

where $$\vec{B}_{eff} \cdot \vec{I} = B_{x'}I_{x'} + \frac{\gamma\tau}{2}B_{z'}B_{x'}I_y + O(\tau^2). \quad (6)$$

Notice that, as deduced from Eq. (5), the result of applying $\pi$ pulses can be interpreted as a "reflection" of the field component perpendicular to the pulse direction during half of the evolution interval. When the inter-pulse spacing is much smaller than the inverse of the maximum frequency created by the gradient coil, the effective value of the field converges to the desired average (first term in the series of Eq. (6)). As expected, the average field points along the direction of the pulses. To find out the direction of the gradient, we rewrite $B_{x'}$ in the unprimed reference frame. It is simple to show that $$B_{x'} = B_x \cos\theta + B_z \sin\theta = g(z\sin\gamma + x\cos\gamma), \quad (7)$$

with $$\gamma = \frac{\pi}{2} - \theta.$$

It follows then $$\vec{B}_{eff} \cdot \vec{I} \approx gx''I_{x'}, \quad (8)$$

where $x'' = z\sin\gamma + x\cos\gamma$.

Figure 4B:
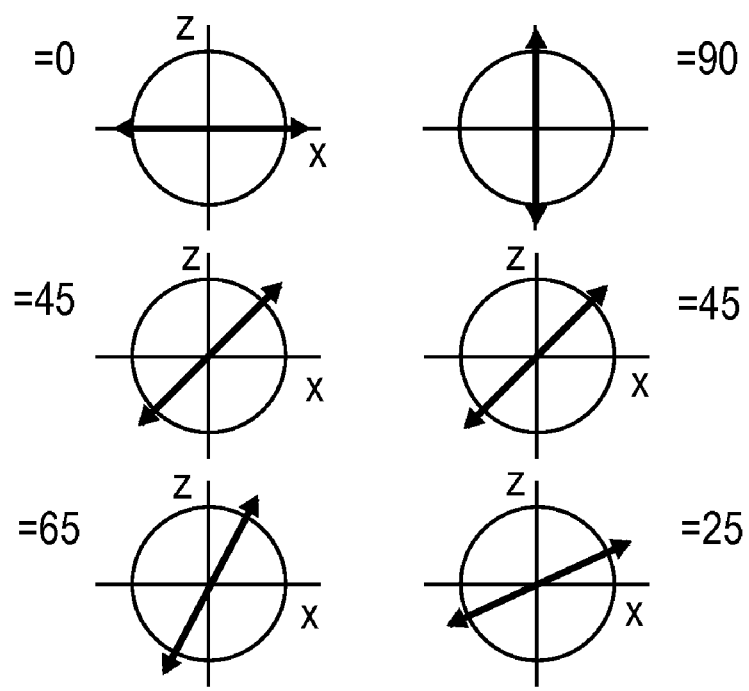

FIG. 4b represents the way this scheme recovers an image. With each train of pulses along an axis $\hat{x}'$ one obtains a projected image of the object along a direction $\hat{x}''$. Notice that, intrinsically, this method is equivalent to projection-reconstruction with the exception that in the present case the change in the gradient direction is accompanied by a simultaneous change in the direction of the (effective) field.

Figure 5A:
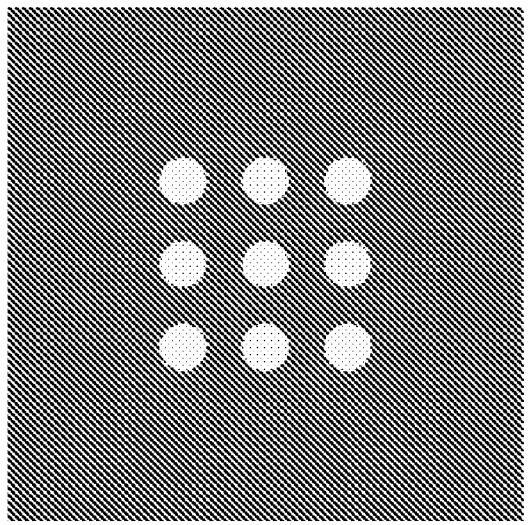
FIG. 5 illustrates a numerically simulated image reconstruction using the method of FIGS. 4A and 4B.

This procedure gives a faithful representation of the original object. FIG. 5A illustrates the reconstruction with a simplified phantom spin magnetization density. The geometry chosen was that of FIG. 5A and, as before, the spins were distributed on a Cartesian grid with 128×128 points. During the simulation, the field gradient was constant and reached a maximum amplitude of 0.08 gauss. The pulses had an amplitude of 3 gauss and a spacing of 0.5 ms. The sample relaxation time was 1 s and, due to the relatively short inter-pulse spacing, effects due to self-diffusion were neglected. The spins were initially aligned in a direction perpendicular to the figure plane.

Figure 5B:
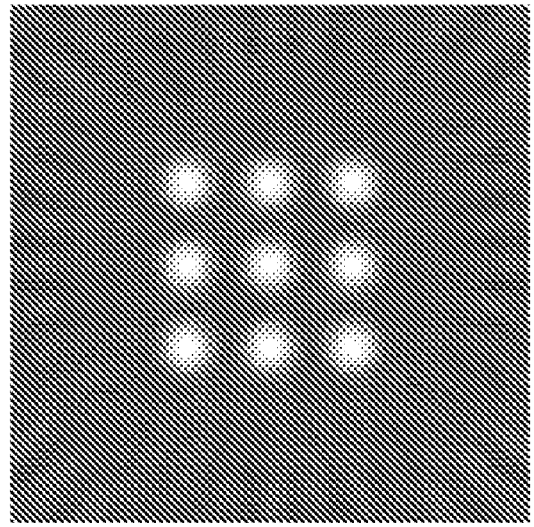
Figure 5C:
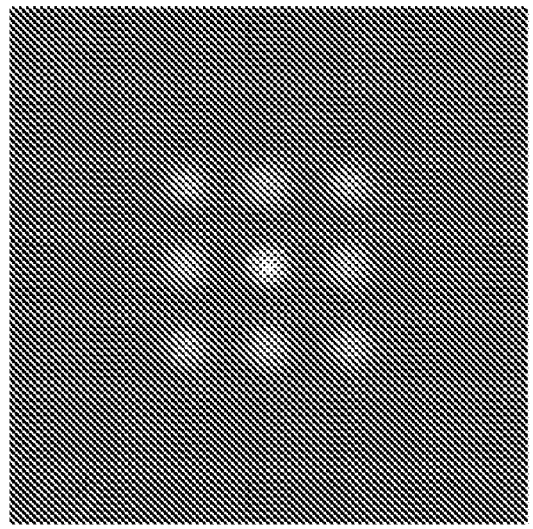
Figure 5D:
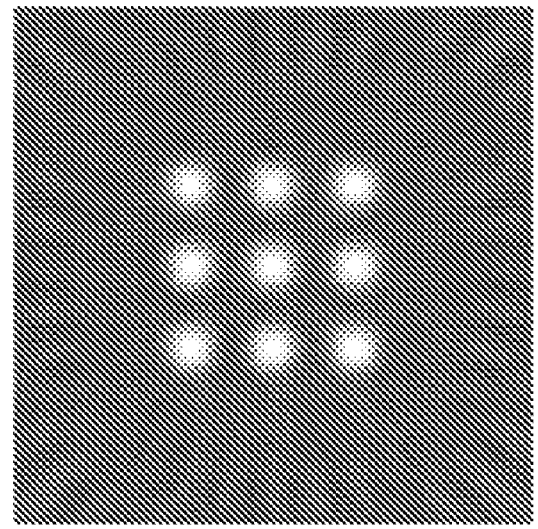

FIG. 5C shows the result of a numerical simulation obtained after 128 projections and standard processing. The figure correctly reproduces the spatial density of the spin system, although some artifacts show up as the distance to the center increases. This effect is intrinsic to the method of projection-reconstruction (FIG. 5B) and in the present case, the problem becomes more acute because the correction terms in Eq. (6) are more important in this region of the sample. In this respect it is worth mentioning that the degree to which Eq. (8) correctly represents the effective Hamiltonian improves considerably if the acquisition is made at half the inter-pulse interval and not at the end (FIG. 5D). This is because the repeating unit during the system evolution becomes symmetric and, as a consequence, all odd terms of the Magnus expansion become zero (see Eqs. (5) and (6)). Such a scheme is advantageous as long as the inter-pulse and acquisition intervals are compatible with the detection dead time.

To introduce the idea underlying a second imaging method, let us start by describing the free evolution of the spin system in the gradient field after a pre-polarization pulse. After a time t, the density matrix of the system is given by the relation $$\rho(t) = U(t)\rho(t=0)U(t)^{-1}, \quad (9)$$

where $U(t) = \exp(-it\gamma \vec{B} \cdot \vec{I})$ is the system evolution operator. Assuming that the pre-polarization pulse is applied along the y-axis, the density matrix is (disregarding proportionality constants) $\rho(0) = I_y$. Inserting this into Eq. (9), it follows that $$\rho(t) = I_y \cos(\omega_r t) - I_x \cos\theta \sin(\omega_r t) + I_z \sin\theta \sin(\omega_r t). \quad (10)$$

If detection is done along the y-axis, the resulting signal is $$S_y(k_r) = \int_0^\infty dr \cos(k_r r) s_y(r), \quad (11)$$

where $$s_y(r) \equiv r \int_0^{2\pi} d\theta\, n(r, \theta),$$

$n(r,\theta)$ is the spin density expressed as a function of the cylindrical coordinates r and θ and $k_r \equiv gt$ is the wave vector. Notice that in Eq. (11), the angular dependence of the spin distribution becomes masked because $s_y(r)$ describes only the projection of this distribution on a ring of radius r. However, when the pre-polarization is done along the x-axis, the induced signal will be $$S_x(k_r) = \int_0^\infty dr \sin(k_r r) s_x(r). \quad (12)$$

In this case, $$s_x(r) = \int_0^{2\pi} d\theta\, rn(r, \theta)\cos\theta$$

indicating that the projection along each ring has now been modulated by the cosine of the angle (or the sine, had the system been pre-polarized along z).

The expressions above can be cast in a general formalism if we notice that, in cylindrical coordinates, the spin density is a periodic function of the angle;

$n(r,\theta) = n(r,\theta+2m\pi)$ for m integer. Hence, we can express $n(r, \theta)$ as $$n(r, \theta) = \frac{1}{2\pi}\sum_{-\infty}^{\infty} c_m(r) e^{im\theta}, \quad (13)$$

with $$c_m(r) = \int_0^{2\pi} d\theta\, rn(r, \theta) e^{-im\theta}.$$

Since, by definition, $n(r,\theta)$ is real, $c_{-m} = c_m^*$. It is then not difficult to observe that the projections in formulas (11) and (12) are related in a simple way to the $m=0, \pm 1$ coefficients of the series (13). Thus, the key point in this scheme turns out to be the fact that we can determine the rest of the coefficients in Eq. (13) if the initial state of the spin system is properly chosen. There are several ways to do this; among them we will briefly describe one below.

Let us consider, for example, two experiments: in both cases, the spins are pre-polarized along the y-axis and evolve freely during an interval τ/2. At the end of this interval, a π pulse is applied, in the first case, along the x-axis (see FIG. 6). A straightforward calculation shows that—after a further interval τ/2—the signal in this case will be $$S'_y(k_r) = -\frac{1}{2}\int_0^\infty dr \cos(k_r r)\left(c_0(r) + \frac{1}{2}c_{-2}(r) + \frac{1}{2}c_2(r)\right). \quad (14)$$

If, however, the pulse is applied along the diagonal on the xz-plane, the signal will be $$S''_y(k_r) = -\frac{1}{2}\int_0^\infty dr \cos(k_r r)\left(c_0(r) + \frac{1}{2i}c_{-2}(r) - \frac{1}{2i}c_2(r)\right). \quad (15)$$

Clearly, both the real and the imaginary components of $c_2(r)$ can be determined by combining the above expressions. If—in a next step—the system is initially prepared along any other direction in the xz-plane, a corresponding set of experiments can be used to determine coefficient $c_3(r)$.

Expressions (14) and (15) can be rewritten in a more compact way if we (arbitrarily) define $c_m(-r)=(-1)^m c_m(r)$. In this case, we have $$S'_y(k_r) = -\frac{1}{2}\left(\frac{1}{2}F^{-1}(c_0) + \frac{1}{4}F^{-1}(c_2^*) + \frac{1}{4}F^{-1}(c_2)\right) \quad (16)$$

$$S''_y(k_r) = -\frac{1}{2}\left(\frac{1}{2}F^{-1}(c_0) + \frac{1}{4i}F^{-1}(c_2^*) - \frac{1}{4i}F^{-1}(c_2)\right),$$

where $$F^{-1}(c_m) \equiv \int_{-\infty}^{\infty} dr\, e^{ik_r r} c_m(r)$$

is the inverse Fourier transform of coefficient $c_m(r)$.

When several π-pulses are used to prepare the initial state (m≧4), the situation becomes more complex because, in general, several echoes form during the acquisition period. A detailed analysis reveals that all of them contain the same information: the same coefficients can be obtained by individually analyzing any of them. If the inter-pulse separation τ is chosen longer than the inverse of the maximum resonance frequency in the sample, the echoes become well-resolved in time and we can limit our acquisition to, for example, only the first one in the string. With these conditions, we provide in FIG. 6 the expressions for a few low order coefficients obtained after different preparation pulse sequences. With each new pulse in the sequence it is possible to determine two new coefficients in the series as a function of the Fourier transform of the measured signal and previous coefficients. With the exception of $c_0(r)$ (which is real), two experiments are necessary to completely determine each coefficient. Nonetheless, one can show that this number becomes one if two mutually orthogonal pick-up coils are used during detection.

Figure 7A:
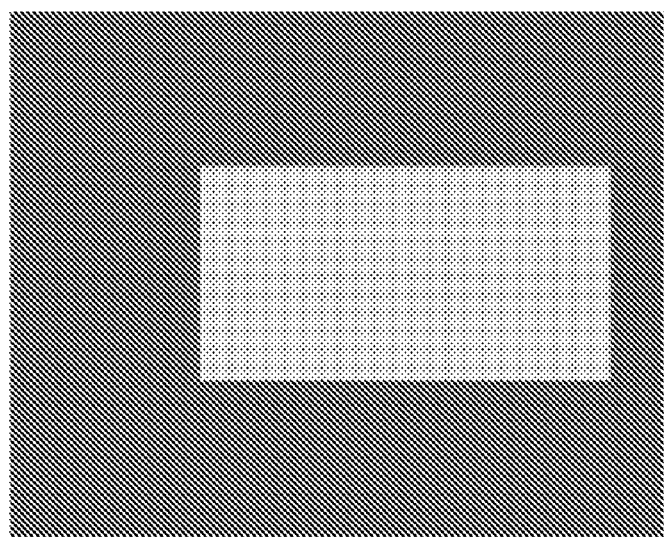
FIG. 7 illustrates a numerically simulated image reconstruction using the method of FIG. 6.
Figure 7B:
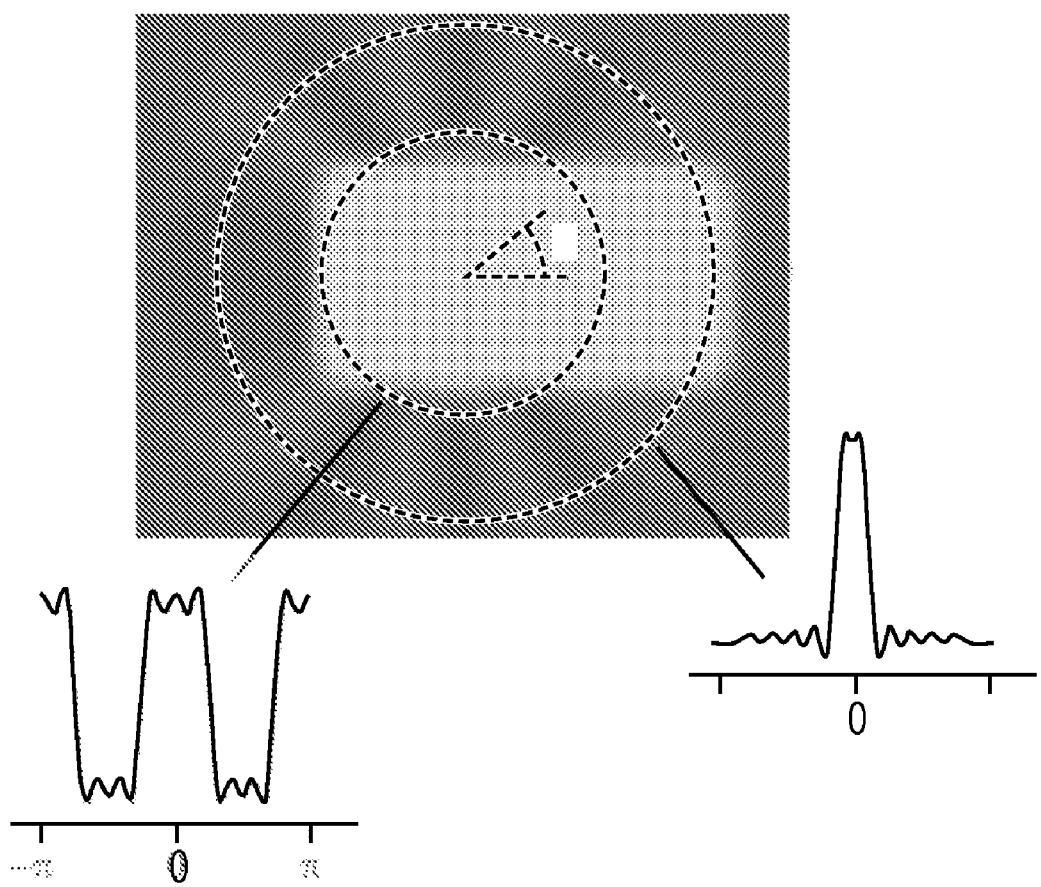

FIG. 7 shows an image of a grid with a model spin distribution after determining 25 coefficients in the Fourier series (m:0,±1 . . . ±12). Notice that, even though the phantom structure is extremely simple, the absence of cylindrical symmetry and the sharp edges in the original spin distribution bring into evidence most of the features intrinsic to this method. According to formula (13), it is clear that an improvement in the angular resolution is only obtained at the expense of determining higher coefficients in the series. However, for a fixed number of coefficients, the image fidelity is here a complex function of the radial position: the image becomes closer to the original distribution whenever only a few coefficients suffice to give a good convergence in the Fourier series.

In practical implementations, a SQUID detector is advantageous as the SQUID is a device sensitive to minuscule fluctuations of the magnetic field and with a flat and almost unlimited frequency response. However, its sensitivity at very low frequencies is hampered because in this region the 1/f noise is dominant. The affected frequency interval varies depending on the SQUID design, but in general other low-frequency noise sources will impair detection sensitivity around DC. In our case, these effects will obviously affect the image quality because the magnitude of the field tends to zero in the central region of the sample. Hence, independently of the chosen scheme, the field of view will in practice be deprived of this central region, where the image will show a bright, featureless disk (similar to the one found for different reasons in FIG. 5C). However, with field gradients of the order of 1 kHz/cm and typical sample sizes, the fraction invisible to the detector is small and, if necessary, can be further reduced by increasing the magnitude of the gradient.

In the first method described above, stroboscopic acquisition is performed with a detector such as a SQUID during a fast train of pulses. Although in some cases the recovery time of the detector is longer than the one found in a tuned circuit at high field, it is important to notice that this time can vary several orders of magnitude from several milliseconds to tens of microseconds depending on the used array. In this last case, the range of useful gradients is obviously very large reaching a maximum of almost 10 kHz/cm. Finally, it is worth pointing out that this scheme could be easily altered to monitor the spin evolution in a point-by-point wise fashion, in which case the dead time problem is solved at the expense of an extra dimension in the acquisition.

Because the first method is based on a projection/reconstruction-like approach to recover the sample image, the sampled points on the reciprocal space are radially distributed and thereby, the image resolution diminishes with the distance to the center. It would be possible to modify this method to make the direction of the pulses change by 90 degrees during the evolution: this would be equivalent to a change in the direction of the gradient in a way similar to the one used in a standard two-dimensional Fourier scheme. In this case, a change in the direction of the effective gradient also creates a change in the direction of the effective field which makes the situation a bit more complex.

In the second method described above, the detector dead time does not represent a relevant problem if the acquisition is initiated at the signal echo after preparing the initial state. However, the relative contribution of each coefficient to the signal decays as the order m increases. Furthermore, the coefficients are determined in an iterative way: the value of $c_m(r)$ is obtained by combining the m-th signal and (several of) the m−1 smaller coefficients. Such a situation can have drawbacks in some cases because the error increases (almost) linearly with the order of the coefficient. This could be solved by a phase cycling on the preparation pulses to filter out from the signal all coefficients but the one desired.

Both schemes could be extended to three dimensions with relatively minor changes if, for instance, the saddle coil is replaced by an anti-Helmholtz array. In the first method, the elimination of this new field component during each projection would be carried out at the expense of an increase in the pulse density of the train (and a cycling of the pulsing direction). In the second method, the preparation pulses could be selected to determine a spin distribution now expressed as a series of spherical harmonics.

The schemes shown above demonstrate that, contrary to what one could expect, it is indeed possible to reconstruct the spatial distribution of nuclear magnetization, whose evolution takes place in a non-uniform magnetic field with zero average value. In general, this idea can be implemented in multiple different ways although here we have specifically considered two schemes. In the first one, we use a pulse train that, on average, alters the symmetry of the gradient field allowing a spatial encoding similar to standard methods in high fields. In the second scheme, the spatial distribution of the spin system is described by a Fourier series and the initial state of the sample is prepared so that the resulting signal provides information relative to the coefficients of this expansion.

Within the frame of SQUID detection, this possibility has particular interest because the absence of a more intense homogeneous field eliminates the restrictions on the amplitude of the gradient used to encode the spin positions (concomitant gradient problem). In principle, such a situation could be advantageous because it translates into an increment of the finally attainable resolution for situations in which, due to different reasons, the magnitude of the magnetic field must be small at all sites.

Many applications require gradient fields of comparable or larger strengths than applied homogeneous fields and would benefit from the above described methods. One is "ex situ NMR," where the sample is not as usual immersed into the $B_0$ field, but placed outside this field. This class of experiments is relevant in cases where, for example, the sample to be investigated is very large or completely immobile and cannot be placed inside a magnet. Another class is magnetic resonance force microscopy (MRFM), where the detection sensitivity is proportional to the strength of the gradient field and therefore very strong gradients are used. MRFM allows for an exquisitely sensitive detection of NMR signals originating from spins located at or close to a surface, a situation where conventional NMR is very difficult to perform. In both instances, one has to deal with an inherently very strong inhomogeneous field and in general it is not possible to supplement this field with a sufficiently strong homogeneous field.

All publications, patents, and patent applications mentioned in this specification are herein incorporated by reference to the same extent as if each individual publication or patent application were each specifically and individually indicated to be incorporated by reference.

The foregoing description details certain embodiments of the invention. It will be appreciated, however, that no matter how detailed the foregoing appears, the invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A method of performing magnetic resonance imaging comprising:
    polarizing a sample;
    encoding information indicative of a spatially varying density distribution of a spin induced magnetization by allowing the spins to evolve in a non-truncated gradient field and rotating the spin induced magnetization through a series of predefined angles at predetermined times;
    detecting an NMR signal produced by said spin magnetization density distribution after at least one of said rotations; and
    reconstructing an image of said spin magnetization density distribution using said detected NMR signal.

2. The method of claim 1, wherein said method is performed in the substantial absence of a spatially homogeneous magnetic field.

3. The method of claim 1, wherein said predefined angles are substantially equal to 180 degrees.

4. The method of claim 1, wherein said detecting step is performed repetitively after every alternate rotation.

5. The method of claim 1, wherein said detecting step is performed after predefined sets of said rotations, and wherein said reconstructing comprises deriving coefficients of a Fourier expansion of an angular spin density dependence from said detected NMR signal.

6. The method of claim 1, wherein said detecting is performed with a SQUID magnetometer.

7. The method of claim 1, wherein said detecting step is performed with an atomic magnetometer.

8. The method of claim 1, wherein said polarizing step is performed with a static magnetic field.

9. The method of claim 1, wherein said polarizing step is performed with hyperpolarized gas.

10. A method of performing magnetic resonance imaging comprising:
    applying a gradient field to a sample, wherein said gradient field has an amplitude that is independent of angular position in a cylindrical coordinate system;
    encoding an angular position dependence into an NMR signal produced by said sample by inducing rotations in the gradient field through a series of predefined angles at predetermined times;
    detecting an NMR signal produced by said sample; and
    reconstructing an image of said sample using said detected NMR signal.

11. The method of claim 10, wherein said gradient field is produced with a saddle coil.

12. The method of claim 10, wherein said encoding is performed with one or more 180 degree magnetization rotations.

13. The method of claim 10, wherein said detecting step is performed with an atomic magnetometer.

14. A method of performing magnetic resonance imaging without a strong homogeneous magnetic field, the method comprising:
    encoding spin density position information into an NMR signal of a sample with both a non-truncated gradient field and with a coordinated series of magnetization rotations and NMR signal acquisitions.

15. The method of claim 14 comprising:
    means for imaging said NMR signal acquisitions from said encoding step.

16. The method of claim 14 comprising:
    polarizing the sample prior to encoding the NMR signal.

17. A method of detecting magnetic resonance signals comprising:
    polarizing a sample magnetization;
    inducing a series of 180 degree magnetization rotations while allowing spin magnetization of said sample to evolve in a non-truncated gradient magnetic field;
    acquiring an NMR signal from said sample between alternate 180 degree spin rotations.

18. The method of claim 17 comprising:
    means for imaging said NMR signal from said acquiring step.

19. The method of claim 17 wherein the inducing step comprises:
    means for inducing 180 degree magnetization rotation in said sample.

20. The method of claim 17 wherein said acquiring step is performed with an atomic magnetometer.

* * * * *